(12) United States Patent
Yahav (10) Patent No.: US 9,099,975 B2
(45) Date of Patent: Aug. 4, 2015

(54) CURRENT DIVIDER BASED VOLTAGE CONTROLLED GAIN AMPLIFIER

(71) Applicant: Broadcom Corporation, Irvine, CA (US)

(72) Inventor: Nir Yahav, Holon (IL)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 13/929,440

(22) Filed: Jun. 27, 2013

(65) Prior Publication Data

US 2014/0368269 A1    Dec. 18, 2014

Related U.S. Application Data

(60) Provisional application No. 61/834,672, filed on Jun. 13, 2013.

(51) Int. Cl.
*H03F 3/45* (2006.01)
*H03G 3/30* (2006.01)

(52) U.S. Cl.
CPC ........................................ *H03G 3/30* (2013.01)

(58) Field of Classification Search
CPC .................................. H03F 3/45; H03G 3/30
USPC ............................ 330/254, 278, 310, 150, 98
See application file for complete search history.

(56) References Cited

U.S. PATENT DOCUMENTS

| | | | | |
|---|---|---|---|---|
| 7,239,205 B2 * | 7/2007 | Nakayama et al. | ........... | 330/277 |
| 7,683,712 B2 * | 3/2010 | Suzaki et al. | ................ | 330/133 |
| 7,688,137 B2 * | 3/2010 | Park et al. | ..................... | 330/133 |
| 8,427,240 B2 * | 4/2013 | Hsieh et al. | ................... | 330/311 |
| 8,471,637 B2 * | 6/2013 | Hoogzaad | .................... | 330/284 |
| 8,712,344 B2 * | 4/2014 | Wang et al. | .................. | 455/102 |
| 8,786,367 B2 * | 7/2014 | Lee et al. | .................... | 330/278 |

* cited by examiner

*Primary Examiner* — Henry Choe
(74) *Attorney, Agent, or Firm* — Sterne, Kessler, Goldstein & Fox P.L.L.C.

(57) ABSTRACT

An RF amplifier includes an input stage, a buffer stage, and an output stage. The input stage is configured to provide attenuation and impedance matching for an input radio frequency (RF) signal by providing shunt and series variable resistance current paths and RF power to RF current conversion. The input stage routes the RF current between the current paths resulting in an attenuation of the RF input current. The buffer stage is configured to provide an intermediate RF current which tracks the current level of the attenuated RF input current, thereby providing isolation between the input and output stages. The output stage is configured to provide RF current to RF power conversion, utilizing the intermediate RF current to provide an RF signal having an RF output power proportional to the RF input power.

20 Claims, 9 Drawing Sheets

CURRENT DIVIDER BASED VOLTAGE CONTROLLED GAIN AMPLIFIER

CROSS-REFERENCE TO RELATED APPLICATIONS/INCORPORATION BY REFERENCE

This application claims priority to U.S. Provisional Application No. 61/834,672, filed Jun. 13, 2013, which is incorporated herein by reference in its entirety.

FIELD OF DISCLOSURE

The present disclosure relates generally to amplifiers and more specifically to radio frequency (RF) amplifiers utilizing current division and conversion between RF current and RF power.

BACKGROUND

RF amplifiers are often implemented in various applications which require manipulation of an RF input power level to provide a desired RF output power level over a range of RF input power levels. Although termed "amplifiers," such devices generally provide both RF input power attenuation as well as amplification, with the resulting proportionality between the input power and the output power referred to as the amplifier gain.

To achieve the desired gain, conventional RF variable gain amplifiers (VGA's) utilize operating point changing techniques and/or voltage variable attenuators (VVA's). To modify the operating point within the amplifier itself, the voltage and/or current applied to the transistors that are a part of the amplifier are varied. However, the RF amplifier linearity, noise, and impedance matching are also dependent upon the operating point of the transistors. Therefore, varying the gain of the RF amplifier through operating point changes can sacrifice non-gain performance of the RF amplifier over the RF amplifier gain range. As a result, the amplitude and frequency range in which RF amplifiers may adequately perform through operating point change implementations is limited. Similarly, VVA implementation results in degraded noise when used at the RF amplifier input, and degraded linearity when used at the RF amplifier output.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

Figure 1:
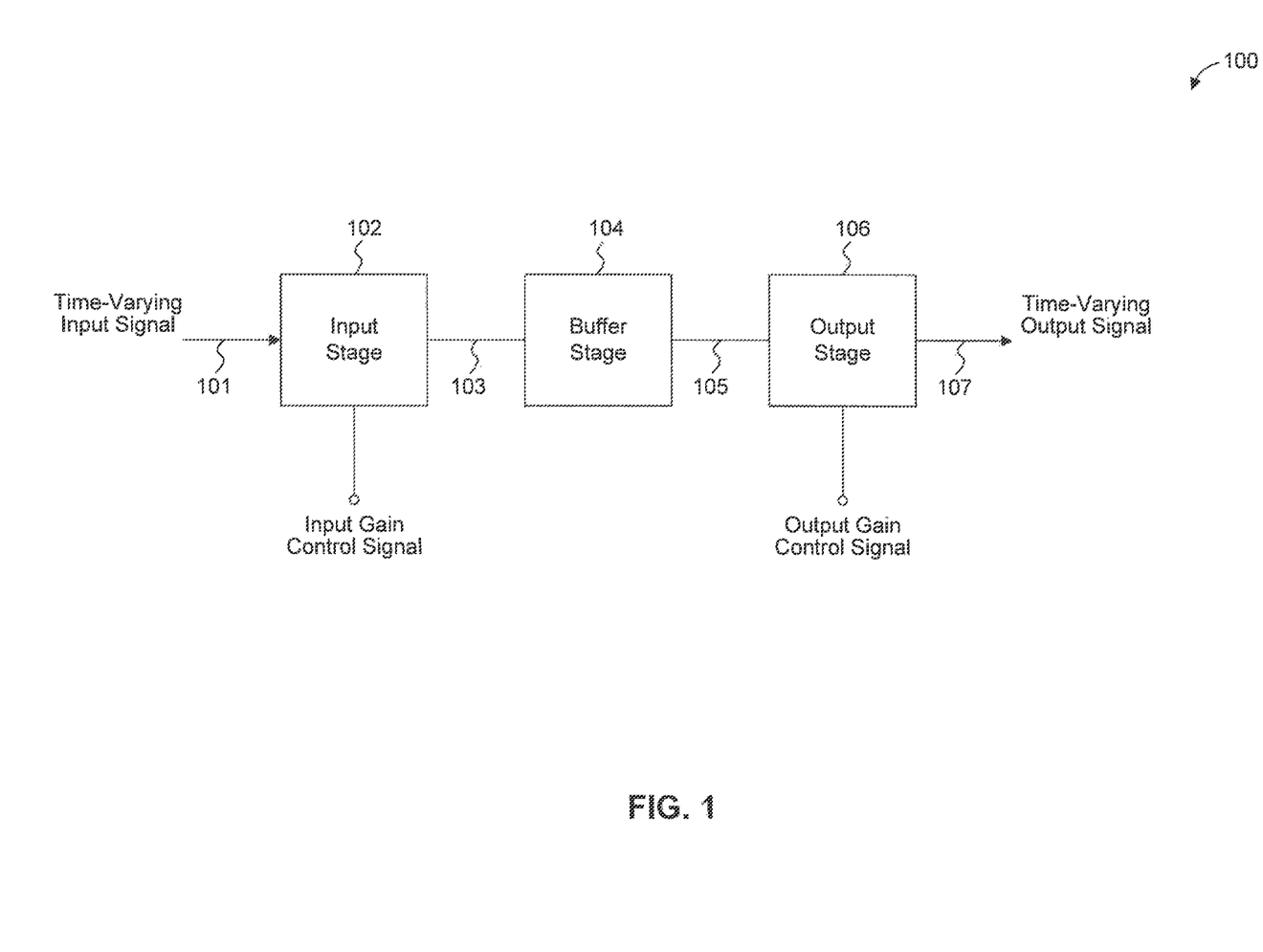
FIG. 1 illustrates an amplifier block diagram according to an exemplary embodiment of the disclosure.

FIG. 1 illustrates an amplifier block diagram according to an exemplary embodiment of the disclosure. Amplifier 100 includes an input terminal 101, an input stage 102, a buffer stage 104, an output stage 106, and output terminal 107.

Amplifier 100 receives a time-varying input signal at input stage 102 via input terminal 101. The time-varying input signal propagates via an input transmission line having a characteristic impedance. The input transmission line is not shown in FIG. 1. The time-varying input signal has a power level which is represented by the product of time-varying current and voltage components of the time-varying signal. The time-varying current and voltage components, in turn, are proportional to one another by a factor represented by the characteristic impedance of the input transmission line in accordance with Ohm's Law.

Input stage 102 is configured to extract a time-varying current component of the time-varying input signal and to attenuate the time-varying current component to provide an attenuated time-varying current to buffer stage 104 via connection 103. Input stage 102 is configured to attenuate the current component of the time-varying input signal by an attenuation factor which is controlled and adjusted by an input gain control signal coupled to input stage 102. Regardless of the attenuation factor, input stage 102 is configured to maintain an impedance at input terminal 101 at a predetermined impedance, such as the characteristic impedance of the input transmission line for example. In this way, input stage 102 acts as a power to current converter and current attenuator.

The input gain control signal provides a variable voltage and/or current to input stage 102. The input gain control signal may provide the variable voltage and/or current utilizing a priori knowledge of a desired attenuation factor and/or output power level signal metric of the time-varying input and/or output signal. For example, a sampling module may sample an input signal metric associated with the time-varying input signal and generate the input gain control signal based on a look up table (LUT) correlating a desired attenuation or gain based on the input signal metric. The sampling module and LUT are not shown in FIG. 1.

To provide another example, the input gain control signal may be generated utilizing feedback received from sampling the time-varying output signal. The input gain control signal may be generated as part of an automatic gain control (AGC) loop which samples an output signal metric of the time-varying output signal and provides the input gain control signal based on the output signal metric. The AGC loop is not shown in FIG. 1.

Buffer stage 104 is configured to receive the attenuated time-varying current via connection 103 and to provide an intermediate time-varying current to output stage 106 via connection 105. Buffer stage 104 is further configured to provide the intermediate time-varying current having a current level which tracks the current level of the attenuated time-varying current. In this way, buffer stage 104 provides isolation between input stage 102 and output stage 106. Buffer stage 104 maintains the current level of the intermediate time-varying current as the output stage 106 converts the intermediate time-varying current to an time-varying output signal via output terminal 107.

Output stage 106 is configured to receive the intermediate time-varying current via connection 105 and to provide a time-varying output signal via output terminal 107. The time-varying output signal propagates via an output transmission line having a characteristic impedance. Output stage 106 converts all or a portion of the intermediate time-varying current to the time-varying output signal having an output power level which is proportional to the input power level of the time-varying input signal by a factor represented by the amplifier gain. Output stage 106 may be configured to match the impedance of output terminal 107 to the characteristic impedance of the output transmission line that is connected to the output terminal 107, and/or to another RF block and/or stage, to prevent transmission line reflections. For example, output stage 106 may include any number of impedance matching networks. The output transmission line and impedance matching networks are not shown in FIG. 1.

An output gain control signal provides a variable voltage and/or current to output stage 106. The amount of current output stage 106 converts to the output time-varying signal 111 is based on the output gain control signal. Similar to the input gain control signal, the output gain control signal may provide a variable voltage and/or current based on a desired output power level through sampling of the intermediate time-varying current, an input signal metric, and/or an output signal metric.

Although input terminal 101, output terminal 107, connections 103, 105, and input and output gain control signals are illustrated in FIG. 1 as a single connections, those skilled in the art will appreciate that the aforementioned terminals, connections, and signal lines may include any number of terminals, connections, control signals and/or buses depending on the signal type of time-varying input signal and time-varying output signal, including differential signaling.

Figure 2A:
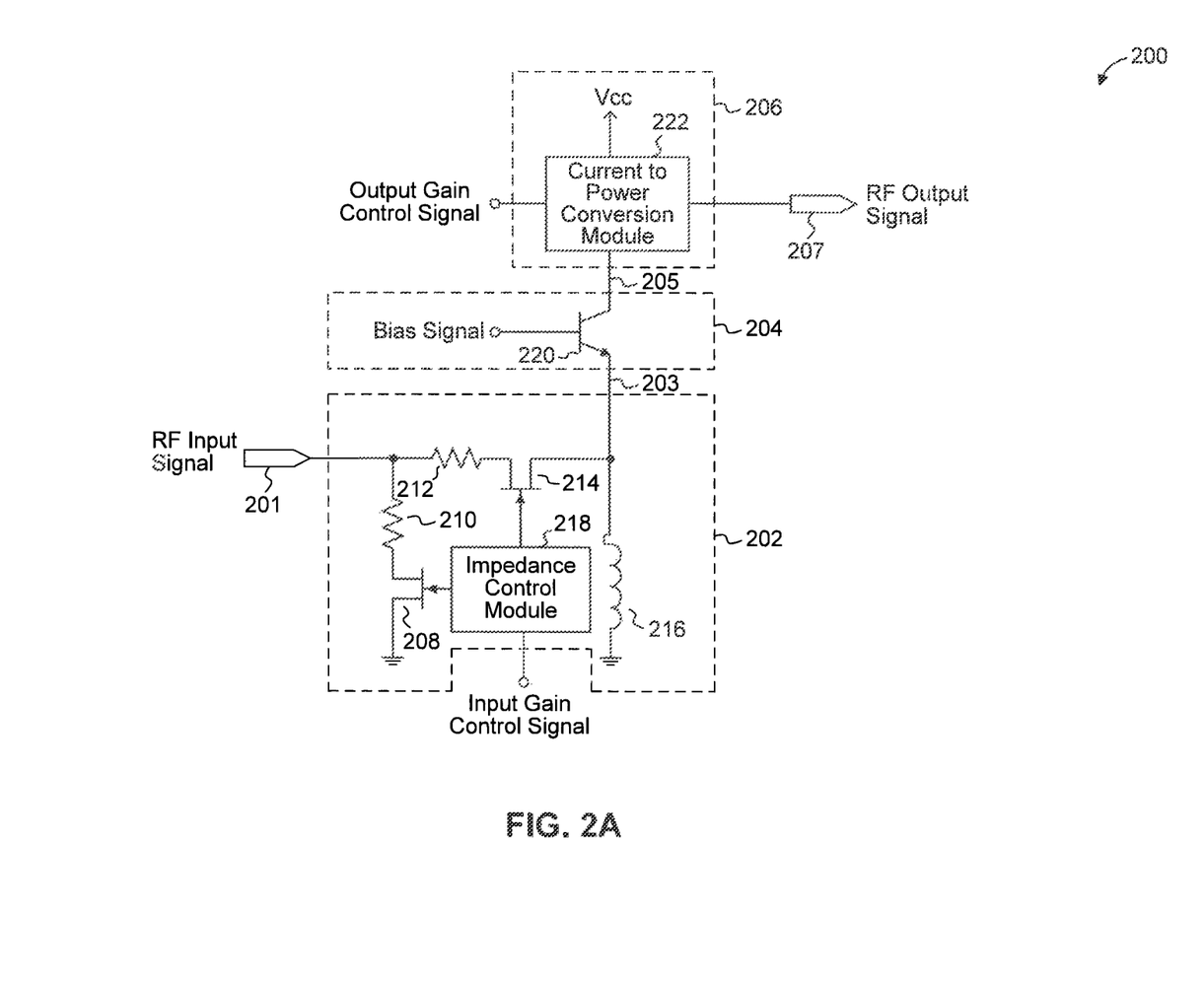
FIG. 2A illustrates a single-ended RF amplifier circuit diagram according to an exemplary embodiment of the disclosure.

FIG. 2A illustrates a single-ended RF amplifier circuit diagram according to an exemplary embodiment of the disclosure. RF amplifier 200 includes RF input terminal 201, input stage 202, buffer stage 204, output stage 206, and RF output terminal 207. Input stage 202, buffer stage 204, and output stage 206 are exemplary embodiments of input stage 102, buffer stage 104, and output stage 106. In accordance with an exemplary embodiment of the present disclosure, the single-ended radio frequency (RF) input and output signals illustrated in FIG. 2 are the time-varying input and output signals of FIG. 1.

RF amplifier 200 receives a single-ended RF input signal at RF input terminal 201 and provides a single-ended RF output signal at RF output terminal 207. The single-ended RF output signal has a power level which is proportional to a power level of the single-ended RF input signal by a factor represented by the overall gain of RF amplifier 200.

Input stage 202 includes a shunting current path, a series current path, and an impedance control module 218. The shunting current path is configured to route a portion of the RF input current to ground, while the series current path is configured to route the remaining portion of the RF current to buffer stage 204 via connection 203 as an attenuated RF current. RF choke 216 provides a direct current (DC) current path to ground for DC components of the RF input signal while allowing the remaining portion of the RF input current to pass to buffer stage 204.

The shunting current path includes resistor 210 and variable resistance element 208, and the series current path includes resistor 212 and variable resistance element 214. Variable resistance elements 208 and 214 each receive a separate first and second impedance control signal at their respective gate terminals from impedance control module 218, which provides each impedance control signal in response to the input gain control signal. In accordance with an exemplary embodiment of the present disclosure, variable resistance elements 208 and 214 are metal oxide semiconductor field effect transistors (MOSFETs). In accordance with such an embodiment, the impedance control signals applied to each gate are varying voltages. In response to the varying voltages, the drain-source resistance of each respective variable resistance element 208 and 214 is varied. Those skilled in the art will recognize that other variable resistance elements could be used, including other transistor types, and are within the scope and spirit of the present disclosure.

The impedance of RF input terminal 201 is represented by the overall combined impedance of the shunting current path, the series current path, the parallel connected RF choke 216, and the input impedance of buffer stage 204. In this way, decreasing the resistance of variable resistance element 208 shunts a portion of the RF input current to ground and provides greater attenuation of the RF input current. To maintain the impedance at RF input terminal 201, the resistance of variable resistance element 214 may be varied to compensate for variations in the resistance in the shunting current path. As a result, input stage 202 provides a desired RF input current attenuation while maintaining the impedance of RF input terminal 201 at a predetermined impedance.

Resistors 210 and 212 set a minimum impedance for the shunting current path and the series current path, respectively. In other words, when either of variable resistance elements 208 or 214 is fully turned on, their respective drain-source resistances will be nearly zero. In such a case, the resistance of shunting current path and the series current path is set by resistors 210 and 212, respectively.

Resistors 210 and 212 also decrease the voltage drop across variable resistance elements 208 and 214, respectively. This decreased voltage drop allows for a larger margin of the control voltage used to vary the resistance of variable resistance elements 208 and 214, which improves the linearity of RF amplifier 200. Those skilled in the art will appreciate that the resistances represented by resistors 210 and 212 may be any combination of series and/or parallel resistances.

Although variable resistance elements 208 and 214 are illustrated in FIG. 2A as MOSFETs, those skilled in the art will appreciate that variable resistance elements 208 and 214 may be implemented using any variable resistance elements which vary their resistance in response to a voltage and/or current signal without departing from the spirit and scope of the present disclosure. For example, variable resistance elements 208 and 214 may be implemented with any combination or number of bipolar junction transistors (BJTs) or heterojunction bipolar transistors (HBTs).

In accordance with an exemplary embodiment of the present disclosure, input stage 202 may include additional shunting current paths and additional series current paths. In such an embodiment, additional shunting current paths and series current paths may be coupled in parallel with the shunting current paths and series current paths as illustrated in FIG. 2A. Additional shunting current paths and series current paths may also include additional resistors and variable resistance elements, and each variable resistance element may be independently controlled with a separate impedance control signal provided by impedance control module 218. Using additional shunting current paths and series current paths, input stage 202 may provide a greater attenuation range to accommodate a larger range of RF input power levels while maintaining the impedance of RF input terminal 201 at a predetermined impedance. As a result, the dynamic range of RF amplifier 200 may be increased.

Buffer stage 204 includes a current regulating element 220. In accordance with an exemplary embodiment of the present disclosure, current regulating element 220 is a transistor. Current regulating element 220 is configured to receive a bias signal at its base terminal and to couple input stage 202 to output stage 206 through its collector-emitter terminals. Current regulating element 220 regulates the attenuated RF current flowing through the series current path to provide an intermediate RF current having a current level which tracks the current level of the attenuated RF current. In this way, buffer stage 204 acts as a current source for output stage 206. As a current source, buffer stage 204 ensures that the attenuated RF current level provided by input stage 202 remains essentially unaffected as output stage 206 converts the intermediate RF current to an RF output signal.

The bias signal applied to the base terminal of current regulating element 220 may be a voltage and/or current signal depending on the type of current control which is implemented for a particular transistor. For example, in an exemplary embodiment of the present disclosure, the bias signal is a base-emitter current, and current regulating element 220 is implemented as a current-controlled current source. In accordance with another exemplary embodiment of the present disclosure, the bias signal is a base-emitter voltage, and current regulating element 220 is implemented as a voltage-controlled current source.

The bias signal applied to the base of current regulating element 220 sets the operating point (Q-point) of current regulating element 220. The bias signal may be a predetermined or a dynamic signal. Similar to the input and output gain control signals, the bias signal may be generated utilizing a table of values (such as a LUT, for example) and/or feedback from a signal metric associated with the RF input and/or output signals. In this way, the operating point of current regulating element 220 may be varied dynamically in response to a power level of the RF input signal. By changing the bias signal in this way, current regulating element 220 is biased adequately to drive the attenuated RF current through its emitter and collector terminals to provide the intermediate RF current over variations of the RF input power level. Furthermore, by adapting the operating point of current regulating element 220 to the RF input power level, less power is wasted through unnecessary dissipation through current regulating element 220, and the overall efficiency of RF amplifier 200 is improved.

Although buffer stage is illustrated in FIG. 2A as a single NPN transistor, those skilled in the relevant art(s) will recognize that any current regulating device may be implemented as buffer stage 204 without departing from the spirit and scope of the present disclosure.

Those skilled in the art will appreciate that buffer stage 204 may be implemented with any number of current regulating elements in addition to current regulating element 220 without departing from the spirit and scope of the present disclosure. For example, current regulating element 220 may be implemented with any number and/or combination of BJTs, HBTs, and/or FETs, any, some, or all of which may be NPN, PNP, n-type and/or p-type devices.

In accordance with an exemplary embodiment of the present disclosure, buffer stage 204 is implemented utilizing a current mirror or may be followed by one. In such an embodiment, the attenuated RF current would represent the reference current to be "mirrored," and the mirrored output current provided as intermediate RF current to output stage 206. Further in accordance with such an embodiment, the bias signal would set the operating point of the transistors implemented in the current mirror based on the RF input power level.

Output stage 206 includes a current to power conversion module 222 coupled to an output gain control signal and to a voltage source Vcc and an RF output terminal 207. Output stage 206 is coupled to buffer stage 204 via connection 205. Output stage 206 is configured to convert the intermediate RF current received via connection 205 to an RF output signal at RF output terminal 207. Similar to the RF input signal, the RF output signal propagates from RF output terminal 207 via a transmission line having an output transmission line characteristic impedance.

Output stage 206 converts the intermediate RF current to the RF output signal by driving a portion of the intermediate RF current through a passive or an active load, which may be configured in series or in parallel between connection 205 and RF output terminal 207. In accordance with an exemplary embodiment of the present disclosure, power conversion module 222 implements an impedance network comprising a passive load (which may constitute a single resistor) coupled between connection 205 and RF output terminal 207.

The impedance network may be implemented as any number of predetermined resistances, such as discrete resistors, for example, or variable resistance elements configured such that their individual resistances are controlled via the output gain control signal. In the case of predetermined and/or discrete impedance networks, the output gain control signal is unnecessary.

In accordance with an exemplary embodiment of the present disclosure, current to power conversion module 222 may implement any number of passive or active loads at each path coupled between RF output terminal 207 and current regulating element 220. In such an embodiment, resistances of variable resistance elements implemented as part of the passive or active load are controlled via the output gain control signal. Although the output gain control signal is illustrated as a single line, the output gain control signal may be implemented as any number of signals, buses, and/or connections to output stage 206. In this way, the output gain control signal may control the resistance of any number of variable resistance elements implemented as part of current to power conversion module 222.

In accordance with an exemplary embodiment of the present disclosure, power conversion module 222 is implemented as a current steering circuit configured to route a portion of the intermediate RF current to an RF ground and/or to Vcc. In this way, output stage 206 provides an RF output signal having an RF power level proportional to the remaining portion of the intermediate RF current which is not routed to ground and/or Vcc. The RF output power level is proportional to the RF input power level by a factor equivalent to the overall gain of RF amplifier 200. Current routing in this way provides RF amplifier 200 with an additional mechanism in which to control the range of RF output power levels for a range of RF input power levels, resulting in increased dynamic range.

In accordance with an exemplary embodiment of the present disclosure, power conversion module 222 implements a current mirror to increase the gain of RF amplifier 200. In such an embodiment, the current mirror may scale the intermediate RF current to provide a scaled version of the intermediate RF current. By providing this scaled intermediate RF current as the input to power conversion module 222, which may further utilize an active or passive load to convert the scaled intermediate RF current to the RF output signal, the gain of RF amplifier 200 may be increased. In addition, because the active or passive loads provide adaptive control over the RF output power level, utilizing the current mirror in conjunction with either an active or passive load implementation negates issues related to increased noise figures which may be introduced by load implementation.

Although the output gain control signal is illustrated as a single line, the output gain control signal may be implemented as any number of signals, buses, and/or connections coupled to power conversion module 222. In this way, the output gain control signal may control the resistance of any number of variable resistance elements implemented as part of output stage 206.

Figure 2B:
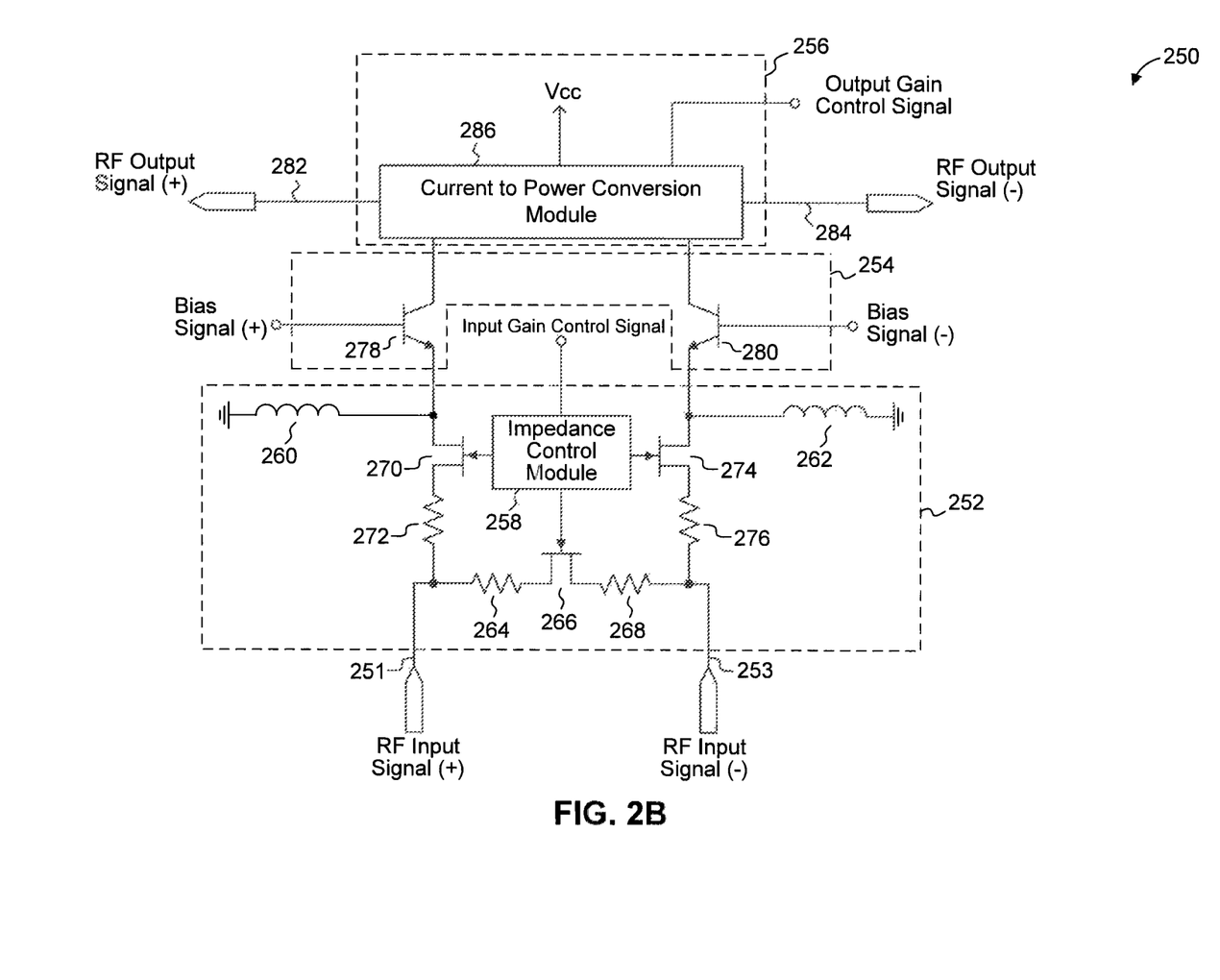
FIG. 2B illustrates a differential RF amplifier circuit diagram according to an exemplary embodiment of the disclosure.

FIG. 2B illustrates a differential RF amplifier circuit diagram according to an exemplary embodiment of the disclosure. RF amplifier 250 includes RF input terminals 251 and 253, input stage 252, buffer stage 254, output stage 256, and RF output terminals 282 and 284. Input stage 252, buffer stage 254, and output stage 256 operate in a substantially similar manner as input stage 202, buffer stage 204, and output stage 206; therefore, only differences between input stage 252, buffer stage 254, and output stage 256 and input stage 202, buffer stage 204, and output stage 206 are to be discussed in further detail.

RF amplifier 250 is configured to receive a complementary pair of RF input signals including RF input signal (+) and RF input signal (−) constituting a differential RF input signal via RF input terminals 251 and 253, respectively. RF amplifier 250 is configured to provide a complementary pair of RF output signals including RF output signal (+) and RF output signal (−) constituting a differential RF output signal via RF output terminals 282 and 284, respectively. The power level of the differential RF output signal is proportional to the power level of the differential RF input signal by a factor representative of the gain of RF amplifier 250.

Input stage 252 includes impedance control module 258, a first series current path coupled to RF input terminal 251, a second series current path coupled to RF input terminal 253, and a shunting current path coupled between the first and the second series current paths. Input stage 252 also includes RF chokes 260 and 262 to provide a DC path to ground while preventing the RF input attenuated currents from being grounded instead of being passed to buffer stage 254.

The shunting current path includes a variable resistance element 266 and resistors 264 and 268. Variable resistance element 266 provides a variable resistance in response to an impedance control signal generated by impedance control module 258 which is coupled to its gate terminal. To provide attenuation of the RF input current received via RF input terminals 251 and 253, the impedance of variable resistance element 266 is varied. In this way, the shunting current path dissipates more of the RF input current by decreasing the impedance of variable resistance element 266, resulting in greater attenuation of the RF input current. Conversely, the shunting path dissipates less of the RF input current by increasing the impedance of variable resistance element 266, resulting in less attenuation of the RF input current. The shunting path effectively provides a lossy shunt to ground as it couples together the differential components of the RF input signal 251/253, thereby creating a virtual ground with a variable resistance.

The first and second series current paths each include a variable resistance element 270 and 274, respectively, and a resistor 272 and 276, respectively. To compensate for the resistive variations in the shunting current path, the resistance of variable resistance elements 270 and 274 may be varied. The resistance of variable resistance elements 270 and 274 is varied in response to a first and a second impedance control signal generated by impedance control module 258, which are coupled to each of their respective gates. In accordance with an exemplary embodiment of the present disclosure, the impedance control signal coupled to each respective gate of variable resistance elements 270 and 274 is the same. In this way, the impedance of the first and second series current paths will equal one another as to not perturb the symmetry of the differential RF input signal. Alternatively, the symmetry can be tuned using unequal impedance control signals. This may be useful if an asymmetry is detected before or after RF amplifier 250.

The first and second series paths couple the remaining portion of the RF input current which is not dissipated through the shunting current path to buffer stage 254 as attenuated RF first and second attenuated RF currents, respectively. Therefore, input stage 252 provides a desired attenuation level of the RF input current levels associated with the RF input signal (+) and RF input signal (−) while maintaining a predetermined impedance at the RF input terminals 251 and 253.

Buffer stage 254 includes current regulating elements 278 and 280. Current regulating elements 278 and 280 provide first and second intermediate RF currents to output stage 256 that have current levels which track the current levels of the first and second attenuated RF currents, respectively. Current regulating elements 278 and 280 each have their respective bases coupled to a bias signal (+) and bias signal (−), respectively.

In accordance with an exemplary embodiment of the present disclosure, current regulating elements 278 and 280 are transistors, which have their respective operating points set by the (+) and (−) bias signals. In accordance with another embodiment of the present disclosure, the (+) and (−) bias signals are the same signal, such that the operating points of current regulating elements 278 and 280 vary together for variations in the (+) and (−) bias signals. In this way, current regulating elements 278 and 280 maintain the same operating points as one another, as to not perturb the symmetry of the differential RF input signal. As a result of the dynamic control of the operating points of current regulating elements 278 and 280, RF amplifier 250 operates with greater efficiency.

Those skilled in the art will appreciate that buffer stage 254 may be implemented with any number of current regulating elements in addition to current regulating elements 278 and 280 without departing from the spirit and scope of the present disclosure. For example, current regulating elements 278 and 280 may be implemented with any number and/or combination of BJTs, HBTs, and/or MOSFETs, any, some, or all of which may be NPN, PNP, n-type and/or p-type devices.

Output stage 256 converts the intermediate first and second RF currents to the differential RF output signal constituting complementary RF output signal (+) and RF output signal (−) via RF output terminals 282 and 284, respectively. The power level of the differential RF output signal is proportional to the power level of the RF input signal by a factor representative of the gain of the RF amplifier 250. In accordance with an exemplary embodiment of the present disclosure, current to power conversion module 286 may implement any number of passive or active loads at each path coupled between each respective RF output terminal 282 and 284 and each current regulating element 278 and 280, respectively.

In such an embodiment, resistances of variable resistance elements implemented as part of the passive or active load are controlled via the output gain control signal. Although the output gain control signal is illustrated as a single line, the output gain control signal may be implemented as any number of signals, buses, and/or connections to output stage 256. In this way, the output gain control signal may control the resistance of any number of variable resistance elements implemented as part of current to power conversion module 286.

Figure 3:
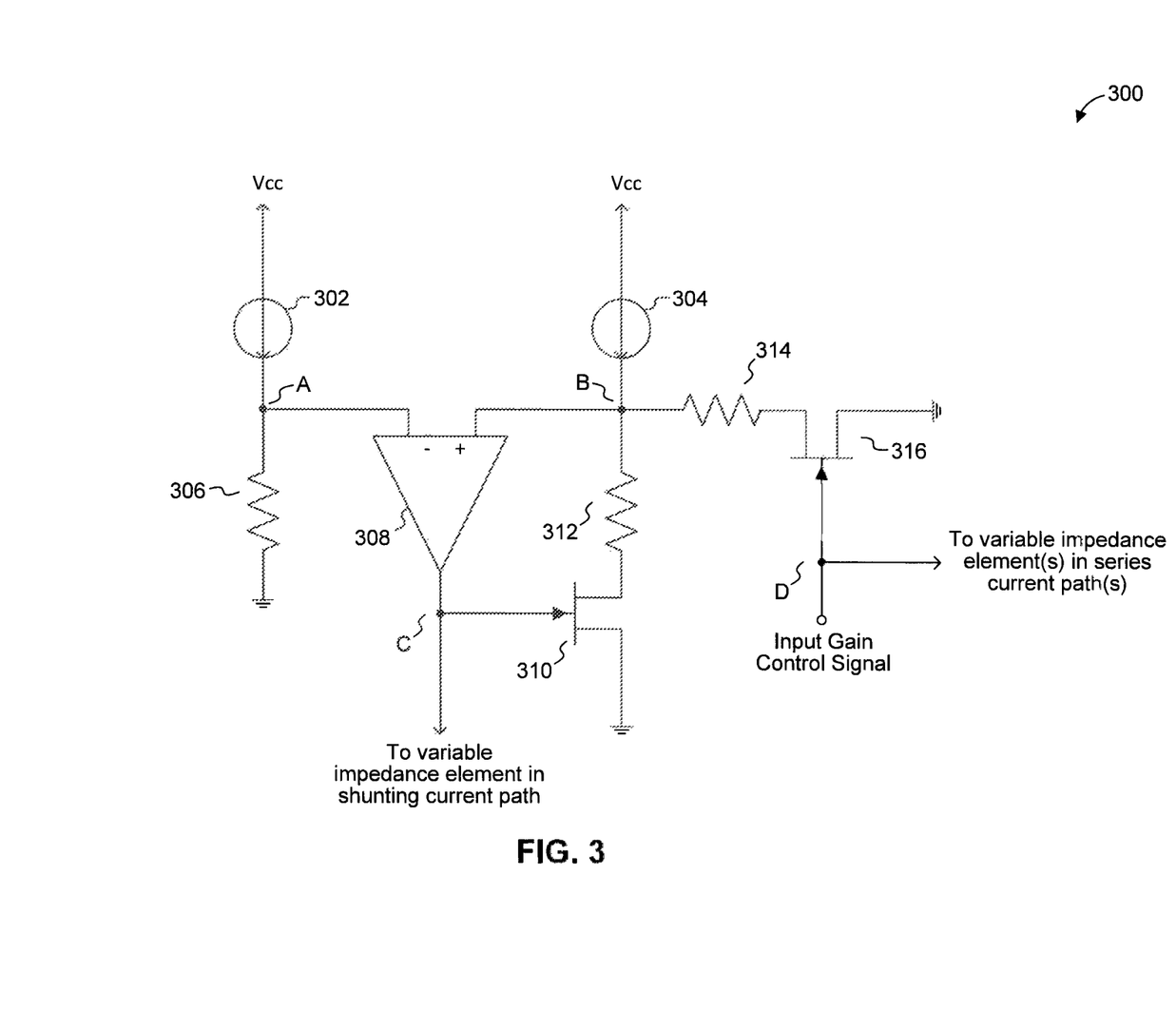
FIG. 3 illustrates an impedance control module circuit diagram according to an exemplary embodiment of the disclosure.

FIG. 3 illustrates an impedance control module circuit diagram according to an exemplary embodiment of the disclosure. Impedance control module 300, that is one embodiment of impedance control module 258, includes current sources 302 and 304, comparator 308, resistors 306, 312, and 314, and variable resistance elements 310 and 316.

Impedance control module 300 is configured to replicate the overall impedance represented by the shunting and series current paths of FIGS. 2A and 2B depending on the type of RF signal. Impedance control module 300 uses the replicated impedance to generate control signals that drive the replicated impedance to a predetermined desired impedance. These same control signals are used to control individual impedances of the series and shunt current paths to drive their combined impedance to the predetermined desired impedance. To achieve this, impedance control module 300 includes a first current path which includes resistor 312 coupled in series with variable resistance element 310. Similarly, impedance control module 300 also includes a second current path which includes resistor 314 couples in series with variable resistance element 316.

Impedance control module 300 may represent an exemplary embodiment of impedance control module 218 or 258, corresponding to single-ended and differential RF signals, respectively. In single-ended RF signal embodiments, the first current path represents a replicated impedance of the shunt current path illustrated in FIG. 2A, including resistor 210 and variable resistance element 208. Further in accordance with such embodiments, the second current path represents a replicated impedance of the series current path illustrated in FIG. 2A, including resistor 212 and variable resistance element 214. Therefore, in a single-ended RF signal embodiment, the resistance of resistors 314 and 312 are the same as the resistance of resistors 212 and 210, respectively. Likewise, in accordance with such an embodiment, the variable resistance response of variable resistance elements 316 and 310 are the same as the variable resistance response of variable resistance elements 214 and 208, respectively. In other words, variable resistance elements 316 and 214 provide the same series resistances for equivalent impedance control signals, and variable resistance elements 310 and 208 provide the same series resistances for equivalent impedance control signals.

In a differential RF signal embodiment, the impedance of the first and second current paths of impedance control module 300 represent a half-circuit equivalent of the overall impedance represented by the shunting and series current paths of FIG. 2B. In accordance with such embodiments, the first current path represents a replicated impedance of the shunt current path illustrated in FIG. 2B, including resistors 264 and 268, and variable resistance element 266. Further in accordance with such embodiments, the second current path represents a replicated impedance of the series current paths illustrated in FIG. 2B, including resistors 272 and 276, and variable resistance elements 270 and 274. For example, the impedance of the second current path of impedance control module 300 matches the impedance of either series current path in FIG. 2B (which may be equal to one another to preserve symmetry). Accordingly, the resistance of resistors 314 is the same as the resistance of resistor 272 (or 276) and the variable resistance response of variable resistance element 316 is the same as the variable resistance response of variable resistance element 270 (or 244).

Further in accordance with the differential signal embodiment, the impedance of the first current path of impedance control module 300 is the same as half of the shunting current path of FIG. 2B. Therefore, the resistance of resistor 312 is the same as half the total resistance of resistors 264 or 268, or either resistor 264 or 268 alone if their resistance is equal. The variable resistance response of variable resistance element 310 should likewise be half the variable resistance response of variable resistance element 266. Variable resistance element 310 may be implemented to provide a series resistance which is half of the resistance of variable resistance element 266 for an equivalent impedance control signal. Furthermore, variable resistance element 310 may be implemented as two variable resistance elements 266 coupled in parallel, each having their respective gate terminals coupled to the output of comparator 308.

Comparator 308 includes a first and second input and an output. The first input is coupled to node A, which is coupled to current source 302 and to resistor 306. The second input is coupled to node B, which is coupled to current source 304, the first current path, and the second current path.

Current sources 302 and 304 are coupled to a power source Vcc and are configured to provide current to nodes A and B. The current provided by current sources 302 and 304 may be the same or different currents. Those skilled in the art will appreciate that current sources 302 and 304 may be implemented with any number of current drivers which provide the same current flow into nodes A and B without departing from the spirit and scope of the present disclosure. For example, current sources 302 and 304 may be implemented using a current mirror.

The current provided from current source 302 results in a voltage drop across resistor 306 to ground, resulting in a voltage at node A. Current from current source 304 is split between the first and second current paths to ground, which in turn results in a voltage at node B proportional to the impedance of the first and second current paths in parallel with one another. Comparator 308 provides an output voltage at node C, which is a voltage representative of an amplified difference between the voltages at nodes A and B at its first and second inputs. The resistance of resistors 312 and 314 ensures that the voltage at node B does not drop below a predetermined voltage, such as the voltage at node A, for example.

The voltage at node C controls the impedance of variable resistance element 310. Variable resistance element 310 and resistor 312 form a feedback path between the output of comparator 308 and the second input of comparator 308. Therefore, the impedance of variable resistance element 310 is decreased as the voltage at node B exceeds the voltage at node A. Since the voltage at node B is directly proportional to the impedance of the first and second current paths in parallel with one another, the voltage at node B is decreased when the impedance of variable resistance element 310 is decreased. In this way, the feedback path maintains the voltage at nodes A and B equal to one another.

The voltage at node A is also proportional to the resistance of resistor 306. The currents provided at nodes A and B may be the same current, or resistor 306 may be scaled accordingly to compensate if the currents are different. In either case, the resistance of resistor 306 is likewise proportional to the resistance of the first and second current paths in parallel with one another. Therefore, as comparator 308 and the first current path (feedback path) maintain the voltage at node A equal to the voltage at node B, the resistance of the first and second current paths in parallel with one another is also driven to equal the resistance of resistor 306. Resistor 306 may be chosen to be any resistive value. In an exemplary embodiment of the present disclosure, the resistance of resistor 306 is chosen to match a desired impedance of the RF input terminal(s). In such an embodiment, resistor 306 is a resistive value which matches a characteristic impedance of the transmission line through which the RF input signal(s) propagate(s), such as 50 Ohms, for example.

In a single-ended RF signal embodiment, node C is coupled to the gate terminal of variable resistance elements 310 and 208, while the input gain control signal is coupled to the gate terminals of variable resistance elements 316 and 214. In a differential RF signal embodiment, node C is coupled to the gate of variable resistance elements 310 and 266, while the input gain control signal is coupled to the gate terminals of variable resistance elements 316, 270, and 274. As shown in FIG. 3, nodes C and D provide a tap off point for the impedance control signals as shown in FIGS. 2A-B.

Therefore, for a single-ended RF signal embodiment, the impedance of both variable resistance elements 316 and 214 is adjusted, and for a differential RF signal embodiment, the impedance of variable resistance elements 316, 270, and 274 is adjusted, in response to the input gain control signal.

The output of comparator 308 at node C varies the impedance of variable resistance element 310 to compensate for the varied impedance of variable resistance element 316. The parallel impedance combination of the first and second current paths maintains a match with the predetermined impedance set by resistor 306. The impedance of the first and second current paths are configured to mirror the equivalent impedances of the shunting and series current path(s), respectively. Therefore, the same control signals at nodes C and D which maintain the parallel impedance combination of the first and second current paths equal to the predetermined resistance set by resistor 306 are also used as impedance control signals to maintain the impedance combination of the shunting and series current paths (in FIGS. 2A and 2B) equal to the same predetermined resistance set by resistor 306. In this way, the input gain control signal allows for the attenuation of the RF input current while maintaining the impedance at RF input terminal 201 equal to a predetermined resistance value.

Figure 4A:
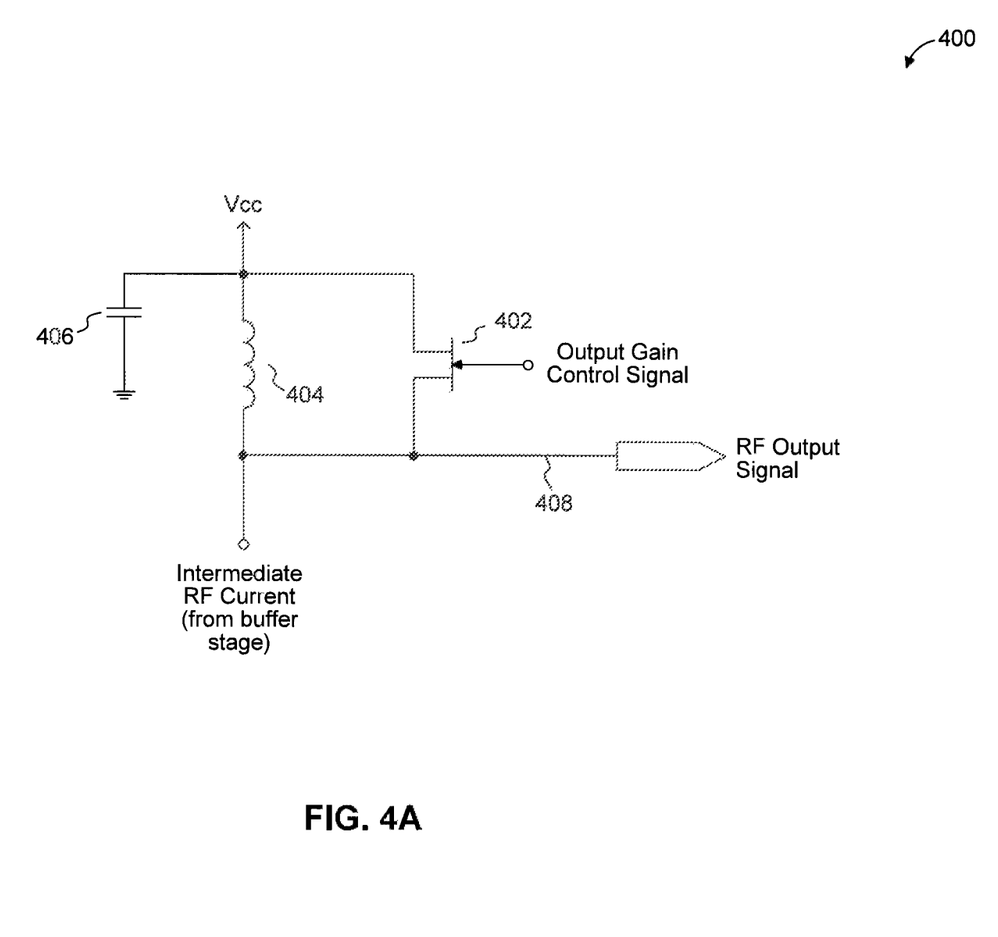
FIG. 4A illustrates a first single-ended current to power conversion module circuit diagram according to an exemplary embodiment of the disclosure.

FIG. 4A illustrates a first single-ended current to power conversion module circuit diagram according to an exemplary embodiment of the disclosure. Current to power conversion module 400 includes a variable resistance element 402, RF choke 404, capacitor 406, and RF output terminal 408. Current to power conversion module 400 is an exemplary embodiment of current to power conversion module 222. In accordance with an exemplary embodiment of the present disclosure, variable resistance element 402 is a MOSFET. Vcc supplies power to the amplifier.

RF choke 404 provides a DC path to Vcc and blocks RF from being transferred to Vcc instead of the output. Capacitor 406 provides a decoupling path to an RF ground for the intermediate RF current in addition to the path to Vcc, and helps prevent the intermediate RF current and/or the RF output signal from inducing noise within the voltage source Vcc.

Current to power conversion module 400 receives the intermediate RF current from buffer module 204 and converts the intermediate RF current to an RF output signal at RF output terminal 408 having an RF power output level. The output gain control signal varies the impedance of variable resistance element 402, and thereby the impedance between Vcc and RF output terminal 408. The power level of the RF output signal is a product of the intermediate RF current and the RF voltage at RF output terminal 408, when referenced to the RF ground. Because the intermediate RF current is provided by a buffer stage, such as buffer stage 204, for example, the intermediate RF current is maintained at the same current level regardless of changes in the resistance of variable resistance element 402. A portion, or all, of the intermediate RF current is output via RF output terminal 408, and the remaining portion, or all, of intermediate RF current is routed to Vcc and the RF ground, where the portions determined based on the impedance of the variable resistance element 402. Decreasing the resistance of variable resistance element 402 routes more current to Vcc and RF ground, and increasing the resistance of variable resistance element 402 routes less current to Vcc and RF ground. In turn, the voltage drop across variable resistance element 402 is increased for a higher resistance, and decreased for a lower resistance. Since the power level of the RF output signal is directly proportional to the voltage drop across variable resistance element 402, the output gain control signal varies the output power level of RF output signal by adjusting the resistance of variable resistance element 402, such that a higher resistance provides a larger output power.

Figure 4B:
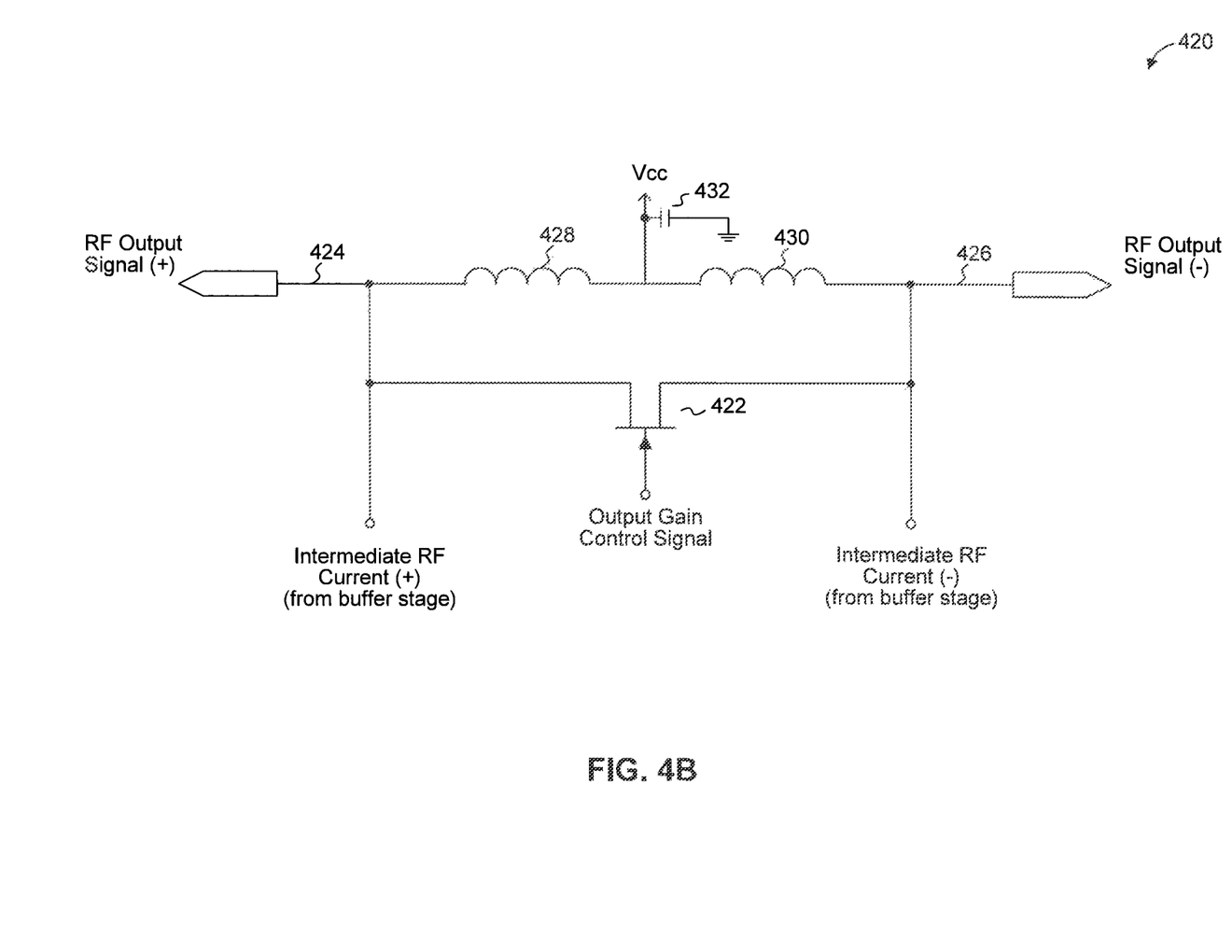
FIG. 4B illustrates a first differential current to power conversion module circuit diagram according to an exemplary embodiment of the disclosure.

FIG. 4B illustrates a first differential current to power conversion module circuit diagram according to an exemplary embodiment of the disclosure. Current to power conversion module 420 includes differential RF output terminals 424 and 426, variable resistance element 422, RF chokes 428 and 430, capacitor 432. Current to power conversion module 420 may be an exemplary embodiment of current to power conversion module 286. In accordance with an exemplary embodiment of the present disclosure, variable resistance element 422 is a MOSFET.

Current to power conversion module 420 operates in a substantially similar manner as current to power conversion module 400; therefore, only differences between current to power conversion module 420 and current to power conversion module 400 are to be discussed in further detail. The RF output signal (+) and the RF output signal (−) are output at differential RF output terminals 424 and 426, which are coupled to the intermediate (+) and (−) RF currents received from a buffer stage, such as buffer stage 254, for example.

The output power level of the RF output (+) and (−) signals is proportional to the product of the sum of the intermediate RF (+) and (−) currents and the voltage between differential RF output terminals 424 and 426. Variable resistance element 422 is coupled between differential RF output terminals 424 and 426, and its resistance, which is provided between differential RF output terminals 424 and 426, is adjusted via the output gain control signal which is coupled to its gate terminal.

Accordingly, when the resistance of variable resistance element 422 is decreased, a portion, or all, of the intermediate RF (+) and (−) currents are shunted through variable resistance element 422 instead of output as current components of the RF output (+) and (−) signals. Conversely, when the resistance of variable resistance element 422 is increased, a portion, or all, of the intermediate RF (+) and (−) currents are routed through the RF output terminals 424 and 426 as current components of the RF output (+) and (−) signals. Since the power level of the RF output (+) and (−) signals is proportional to the current components of the RF output (+) and (−) signals, the output gain control signal adjusts the power level of the RF output (+) and (−) signals by varying the resistance of variable resistance element 422. In other words, the higher the resistance of variable resistance element 422, the higher the output power and more current is provided to differential outputs 424 and 426. As the resistance is lowered, a lossy virtual ground is formed that begins to short the differential outputs, thereby lowering the output power.

Figure 4C:
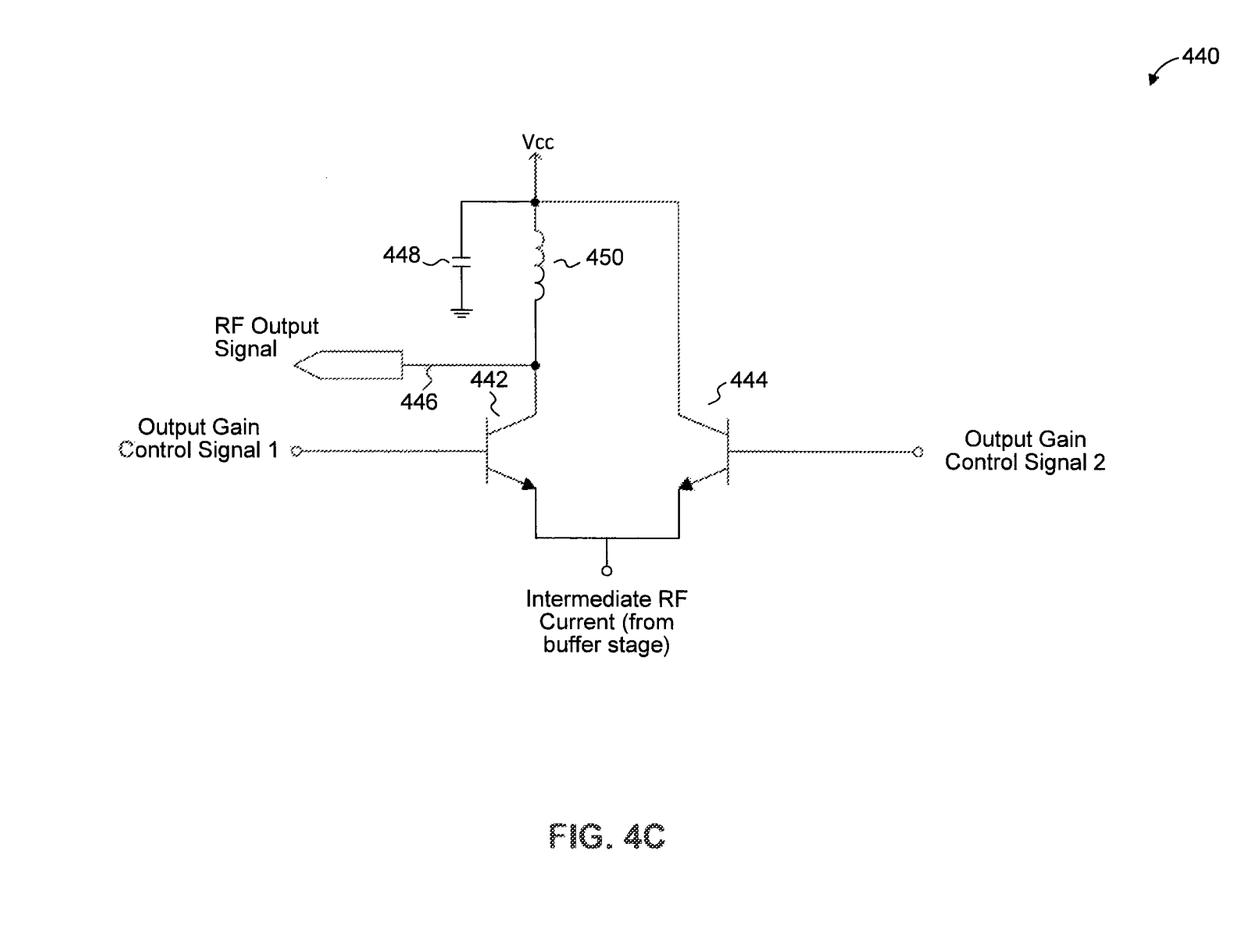
FIG. 4C illustrates a second single-ended current to power conversion module circuit diagram according to an exemplary embodiment of the disclosure.

FIG. 4C illustrates a second single-ended current to power conversion module circuit diagram according to an exemplary embodiment of the disclosure. Current to power conversion module 440 functions as a current steering device and includes RF output terminal 446, current regulating elements 442 and 444, RF choke 450 and capacitor 448. Current to power conversion module 440 is an exemplary embodiment of current to power conversion module 222. In accordance with an exemplary embodiment of the present disclosure, current regulating elements 442 and 444 are transistors.

The voltage source Vcc provides proper bias voltage levels for current regulating elements 442 and 444. While current regulating elements 442 and 444 are biased in this way, the amount of the intermediate RF current flowing through current regulating elements 442 and 444 is controlled via the output gain control signals 1 and 2, respectively. The intermediate RF current may be provided from a buffer stage, such as buffer stage 204, for example. More specifically, the voltage applied at the base terminal of current regulating elements 442 and 444 increases or decreases the amount of intermediate RF current that is provided through the respective collector terminals of current regulating elements 442 and 444.

RF choke 450 provides a DC path to Vcc, as Vcc also acts as a current sink for DC components of the current passed by current regulating elements 442 and 444. RF choke 450 prevents the RF output signal from being coupled into the voltage source Vcc. Capacitor 448 provides a decoupling path to an RF ground for the current passed by current regulating elements 442 and 444, in addition to the path to Vcc, and further helps prevent the RF output signal from inducing noise within the voltage source Vcc.

Current regulating elements 442 and 444 work together to control the overall RF output current level which is part of the RF output signal at RF output terminal 446. Current regulating element 442 passes a portion, or all, of the intermediate RF current to RF output terminal 446, while current regulating element 444 sinks a portion, or all, of the intermediate RF current output to Vcc and the RF ground. In accordance with an exemplary embodiment of the present disclosure, output gain control signals 1 and 2 are dependently controlled. In this way, current regulating elements 442 and 444 control how much of the intermediate RF current is steered to the RF output terminal 446, and how much is steered to RF ground. In other words, a first portion of the intermediate RF current is steered to the RF output terminal 446 and a second portion of the intermediate RF current is steered to RF ground, where the first and second portions are determined by the relative input or base-emitter conductance of the current steering elements 442 and 444 as determined by their corresponding gain control signals. Because the RF output signal power level is proportional to the RF output current level provided at RF output terminal 446, output gain control signals 1 and 2 control the power level of the RF output signal through regulation of the current steered to the RF output terminal 446.

Figure 4D:
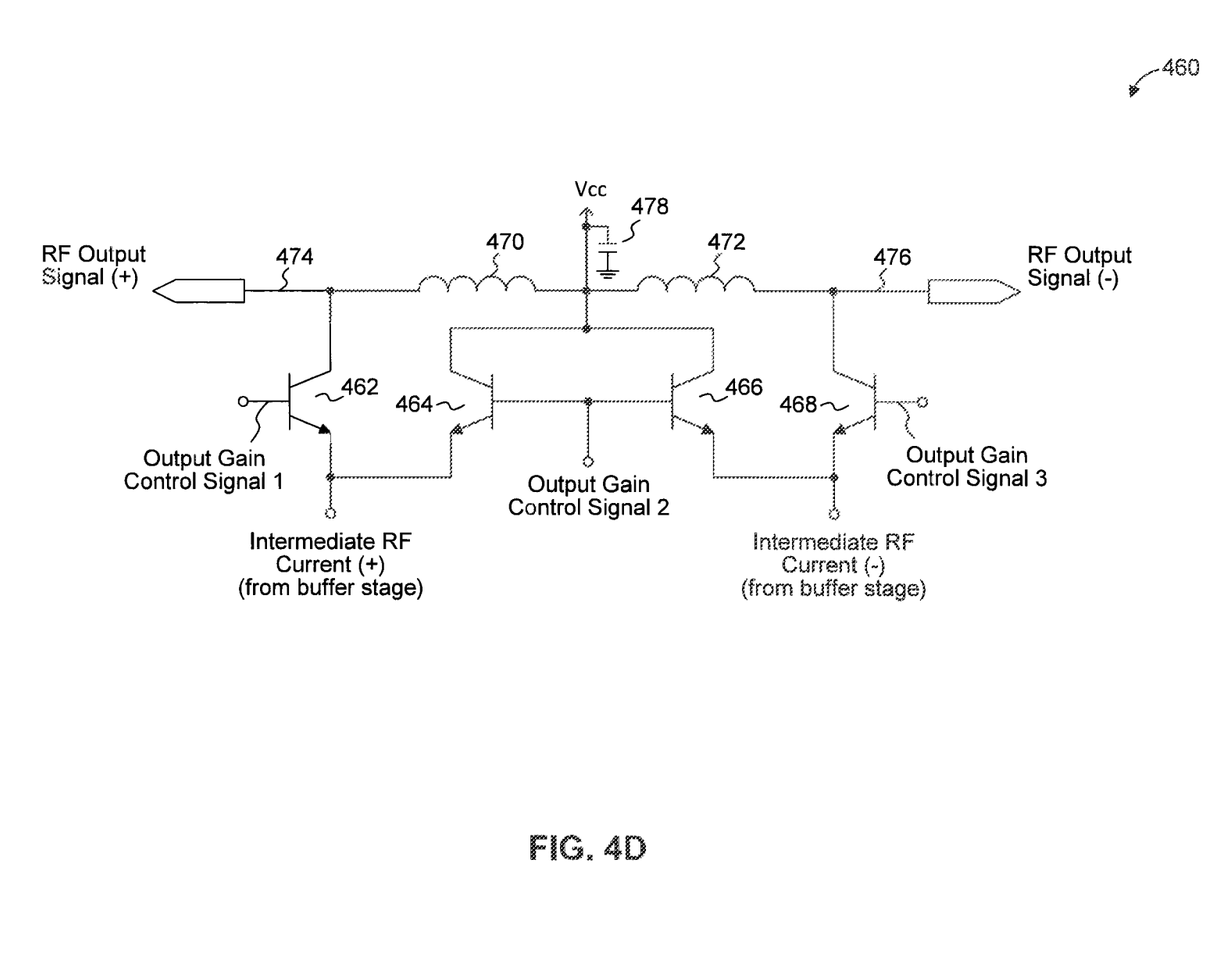
FIG. 4D illustrates a second differential current to power conversion module circuit diagram according to an exemplary embodiment of the disclosure.

FIG. 4D illustrates a second differential current to power conversion module circuit diagram according to an exemplary embodiment of the disclosure. Current to power conversion module 460 functions as a current steering device and includes RF output terminals 474 and 476, current regulating elements 462, 464, 466, and 468, RF chokes 470 and 472, and capacitor 478. Current to power conversion module 420 is an exemplary embodiment of current to power conversion module 286. In accordance with an exemplary embodiment of the present disclosure, current regulating elements 462, 464, 466, and 468 are transistors.

Current to power conversion module 460 operates in a substantially similar manner as current to power conversion module 440; therefore, only differences between current to power conversion module 460 and current to power conversion module 440 are to be discussed in further detail.

Current regulating elements 462, 464, 466, and 468 regulate the amount of intermediate RF (+) and (−) currents which are passed to RF output terminals 474 and 476 in response to the output gain control signals 1-3. More specifically, output gain control signals 1 and 3 steer all, or a portion of the intermediate RF (+) and (−) currents to RF output terminals 474 and 476, respectively via current regulating elements 462 and 468. Output gain control signal 2 steers all, or a portion of the intermediate RF (+) and (−) currents to Vcc and the RF ground via current regulating elements 462 and 466.

Output gain control signals 1-3 may be controlled independently. In accordance with an exemplary embodiment of the present disclosure, output gain control signals 1 and 3 are the same output gain control signal. In accordance with such an embodiment, the amount of intermediate RF current (+) current steered to output terminal 474 via current regulating element 462 matches the amount of intermediate RF current (−) steered to differential output terminal 476 via current regulating element 468.

The relative input or base-emitter conductances of the current regulating elements 462,468 when compared to those of 464,466 determine the relative portion of intermediate RF current that is steered to the RF output terminals 474,476 compared to the portion steered to RF ground. The differential RF output signal power level is proportional to the overall RF output current level provided at RF output terminals 474 and 476. Therefore, output gain control signals 1-3 control the power level of the differential RF output signal through regulation of the current steered to the RF output terminals 474 and 476, respectively. As will be apparent based on the discussion herein, lowering the relative impedance of the current regulating elements 462,468 corresponding increases the relative portion of intermediate RF currents that are steered to the output terminals 474,476, and thereby increases the RF output power.

Figure 5:
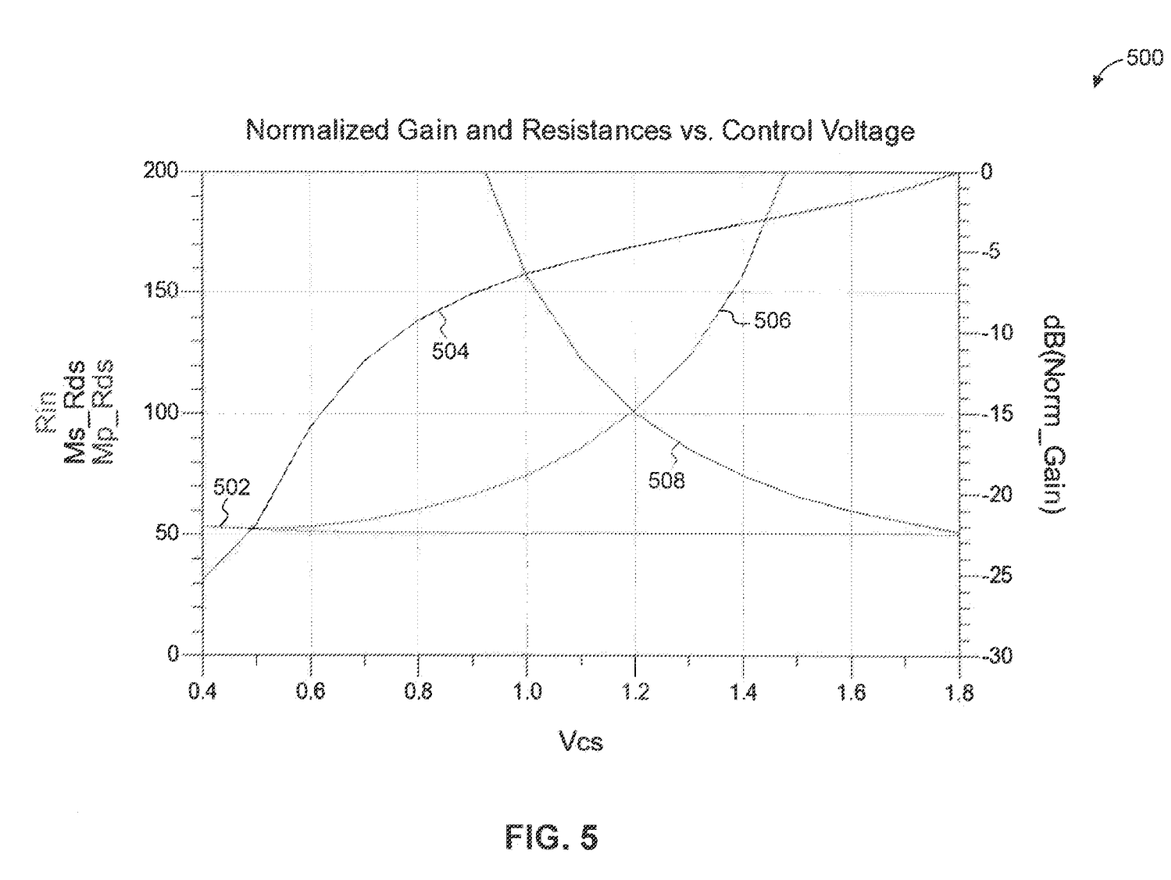
FIG. 5 illustrates a graph of normalized gain and resistances versus gain control signal voltage according to an exemplary embodiment of the disclosure.

FIG. 5 illustrates a graph of normalized gain and resistances versus gain control signal voltage according to an exemplary embodiment of the disclosure. For simplicity, graph 500 illustrates gain and resistance values in reference to RF amplifier 200, according to an exemplary embodiment of the present disclosure whereby variable resistance elements 208, 214, 312, and 316 are all MOSFET devices, and whereby the input gain control signal and the first impedance control signal, and the second impedance control signal are varying voltages. FIG. 5 provides a left y-axis which represents resistive values in Ohms, a right y-axis which represents gain values in decibels (dB), and an x-axis which represents voltage levels in volts.

Graph 500 illustrates traces 502, 504, 506, and 508. Trace 502 corresponds to the impedance of RF input terminal 201. Trace 504 represents the gain of RF amplifier 200. Traces 506 and 508 correspond to the resistance of variable resistance elements 208 and 214, respectively. Graph 500 provides the corresponding data as traces 502, 504, 506, and 508 for a varying input gain control signal voltage.

Graph 500 indicates that the resistance between the drain and source terminals of variable resistance element 208 increases from approximately 50 Ohms to 200 Ohms or more corresponding to input gain control signal voltage values between approximately 0.4 Volts and 1.5 Volts. The control signal voltage values may have any voltage range; however, graph 500 illustrates the response of traces 502, 504, 506, and 508 for control signal voltages in the range as illustrated in accordance with an exemplary embodiment of the present disclosure.

In contrast, the resistance between the drain and source terminals of variable resistance element 214 decreases from approximately 200 Ohms (or greater) to 50 Ohms corresponding to input gain control signal voltage values between approximately 0.9 Volts and 1.8 Volts. Although graph 500 truncates the resistance axis at 200 Ohms, the resistance of variable resistance elements 208 and 214, (traces 506 and 508) may exceed 200 Ohms.

The gain of RF amplifier 200, in turn, varies from approximately −25 dB to 0 dB corresponding to input gain control signal voltage values between approximately 0.4 Volts and 1.8 Volts. The impedance of RF input terminal 201, in turn, is maintained at 50 Ohms regardless of the voltage variations of the input gain control signal.

In accordance with an exemplary embodiment of the present disclosure, resistor 306 is likewise 50 Ohms, resulting in the values shown for trace 502. Therefore, graph 500 illustrates the impedance of RF input terminal 201 is maintained at a predetermined impedance regardless of the resistances of variable resistance elements 208 and 214 and the gain of RF amplifier 200.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail may be made therein without departing from the spirit and scope of the disclosure. Thus the disclosure should not be limited by any of the above-described exemplary embodiments, but should be defined only in accordance with the following claims and their equivalents.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include non-transitory machine-readable mediums such as read only memory (ROM); random access memory (RAM); magnetic disk storage media; optical storage media; flash memory devices; and others. As another example, the machine-readable medium may include transitory machine-readable medium such as electrical, optical, acoustical, or other forms of propagated signals (e.g., carrier waves, infrared signals, digital signals, etc.). Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

What is claimed is:

1. An amplifier, comprising:
an input stage configured to extract a first radio frequency (RF) current having a first RF current level from an RF input signal having an input power level, the input stage including
a shunting current path including a first variable resistance element, the shunting current path being configured to shunt a portion of the RF input signal to a ground, and
a series current path including a second variable resistance element, the series current path being configured to attenuate the RF input signal and provide the first RF current; and
a buffer stage configured to regulate a second current level of a second RF current to substantially track the first RF current level; and
an output stage configured to convert the second RF current to an RF output signal having an output power level, the output power level being proportional to the input power level,
wherein the input stage is further configured to substantially maintain a predetermined input impedance for variations in the first RF current level.

2. The amplifier of claim 1, wherein the buffer stage comprises:
a transistor having a first terminal, a second terminal, and a third terminal, wherein the transistor is configured to regulate the current level of the second RF current in response to a bias signal applied at the first terminal.

3. The amplifier of claim 1, wherein:
the shunting current path comprises a first resistor coupled in series with the first variable resistance element, and
the series current path comprises a second resistor coupled in series with the second variable resistance element.

4. The amplifier of claim 1, wherein the input impedance is a combination of a resistance of the shunting current path and the series current path.

5. The amplifier of claim 4, further comprising:
an impedance control module configured to provide first and second impedance control signals,
wherein the second impedance control signal is an input gain control signal,
wherein the first impedance control signal is generated in response to the input gain control signal, and
wherein the resistance of the shunting current path and the series current path are adjusted in response to the first impedance control signal and the input gain control signal, respectively, such that the resistance of the series current path compensates for changes in the resistance of the shunting current path to maintain the input impedance for variations in the resistance of the series current path.

6. The amplifier of claim 5, wherein the impedance control module comprises:
a comparator having a first input, a second input, and an output;
a first current path coupled between the second input and the ground forming a feedback path between the output and the second input:
a second current path coupled between the second input and the ground; and
a third current path including a resistor determined based on the predetermined input impedance, the third current path being coupled between the first input and the ground.

7. The amplifier of claim 6,
wherein the first and second current paths include first and second transistors, respectively,
wherein the input gain control signal adjusts an impedance of the second transistor, and
wherein the comparator is further configured to generate the first impedance control signal at the output to adjust an impedance of the first transistor to compensate for changes in the impedance of the second transistor such that an impedance at the second input is maintained substantially equal to an impedance at the first input for variations in the impedance of the first transistor, the impedance at the first input being the predetermined impedance.

8. An amplifier, comprising:
an input stage having an input impedance determined by a plurality of current paths and configured to route first and second radio frequency (RF) currents extracted from an RF input signal through the plurality of current paths so as to provide first and second attenuated RF currents, and to maintain the input impedance substantially at a predetermined impedance over variations in current levels of the first and second attenuated RF currents:
a buffer stage configured to provide first and second intermediate RF currents having current levels that substantially track the current levels of the first and second attenuated RF currents, respectively; and
an output stage configured to convert the first and second intermediate RF currents to an RF output signal having a power level proportional to a power level of the RF input signal.

9. The amplifier of claim 8, wherein the RF input signal is a differential RF signal having first and second complementary RF signals, and wherein the first and second RF currents are associated with the first and second complementary RF signals, respectively.

10. The amplifier of claim 9, wherein the input stage is further configured to receive the first and second complementary RF signals via first and second terminals, respectively, and wherein the plurality of current paths comprise:
a shunting current path coupled between the first and second terminals, the shunting current path including a first variable resistance element;
a first series current path coupled to the first terminal, the first series current path including a second variable resistance element; and
a second series current path coupled to the second terminal, the second series current path including a third variable resistance element, and wherein the input impedance is a combination of a resistance of the shunting current path and the first and second series current paths.

11. The amplifier of claim 10, wherein the buffer stage comprises:
a first transistor having a first terminal, the first transistor being coupled to the first series current path and configured to regulate the first intermediate RF current level in response to a bias signal applied at the first terminal; and
a second transistor having a second terminal, the second transistor being coupled to the second series current path and configured to regulate the second intermediate RF current level in response to the bias signal applied at the second terminal.

12. The amplifier of claim 11, further comprising:
an impedance control module configured to provide first, second, and third impedance control signals,
wherein the first and second impedance control signals are a single input gain control signal,
wherein the third impedance control signal is generated in response to the input gain control signal, and
wherein a resistance of the first, second, and third variable resistance elements is adjusted in response to the first, second, and third impedance control signals, respectively, such that the resistance of the first and second series current paths compensates for changes in the resistance of the shunting current path to maintain the input impedance for variations in the resistance of the shunting current path.

13. The amplifier of claim 12, wherein the impedance control module comprises:
a comparator having a first input, a second input, and an output;
a first current path including a fourth variable resistance element coupled between the second input and a ground forming a feedback path between the output and the second input;
a second current path including a fifth variable resistance element coupled between the second input and the ground; and
a third current path including a resistor representative of the predetermined impedance, the third current path being coupled between the first input and the ground.

14. The amplifier of claim 13, wherein the first, second, third, fourth, and fifth variable resistances are first, second, third, fourth, and fifth transistors, respectively,
wherein the input gain control signal adjusts an impedance of the fifth transistor, and
wherein the comparator is further configured to generate the third impedance control signal at the output to adjust an impedance of the fourth transistor to compensate for changes in the impedance of the fifth transistor such that an impedance at the second input is maintained substantially equal to an impedance at the first input for variations in the impedance of the fourth transistor, the impedance at the first input being the predetermined impedance.

15. The amplifier of claim 10, wherein:
the shunting current path comprises a first resistance coupled in series with the first variable resistance element,
the first series current path comprises a second resistance coupled in series with the second variable resistance element, and
the second series current path comprises a third resistance coupled in series with the third variable resistance element.

16. An amplifier, comprising:
an input radio frequency (RF) terminal configured to receive an RF input signal having an RF input current and an RF input power level;
a shunting current path including a first variable resistance element, the shunting current path configured to shunt a portion of the RF input current to a ground;
a series current path including a second variable resistance element, the series current path configured to attenuate the RF input current to provide an attenuated RF current having an attenuated current level;
an impedance control module configured to adjust an impedance of the first and second variable resistance elements so as to substantially maintain an input impedance of the RF input terminal for variations in the attenuated current level;
a current regulating element configured to provide an intermediate RF current having a current level which substantially tracks the attenuated current level; and
a current to power conversion module configured to convert the intermediate RF current to an RF output signal having an output power level proportional to the RF input power level.

17. The amplifier of claim 16, wherein:
the impedance control module is further configured to provide first and second impedance control signals,
the input impedance is a combination of a resistance of the shunting current path and the series current path,
the second impedance control signal is an input gain control signal,
the first impedance control signal is generated in response to the input gain control signal, and
a resistance of the first and second variable resistance elements is adjusted in response to the input gain control signal and the second control signal, respectively such that the resistance of the series current path compensates for changes in the resistance of the shunting current path to maintain the input impedance for variations in the resistance of the shunting current path.

18. The amplifier of claim 17, wherein the impedance control module comprises:
a comparator having a first input, a second input, and an output;
a first current path including a third variable resistance element coupled between the second input and a ground forming a feedback path between the output and the second input;
a second current path including a fourth variable resistance element coupled between the second input and the ground,
a third current path including a resistor determined based on a predetermined impedance, the third current path being coupled between the first input and the ground.

19. The amplifier of claim 18, wherein the first, second, third, and fourth variable resistance elements include first, second, third, and fourth transistors, respectively, and
wherein the comparator is further configured to generate the first impedance control signal at the output to adjust an impedance of the first transistor to compensate for changes in an impedance of the second transistor such that an impedance at the second input is maintained substantially equal to an impedance at the first input for variations in the impedance of the first transistor, the impedance at the first input being the predetermined impedance.

20. The amplifier of claim 1, further comprising: an impedance control module configured to adjust an impedance of the first and second variable resistance elements so as to substantially maintain the predetermined input impedance for variations of the RF input current level.

* * * * *